United States Patent
Wang et al.

(10) Patent No.: US 9,887,534 B2
(45) Date of Patent: Feb. 6, 2018

(54) POWER CONVERTER, SHORT-CIRCUIT DETECTING DEVICE THEREOF AND SHORT-CIRCUIT DETECTING METHOD THEREOF

(71) Applicant: Delta Electronics (Shanghai) Co., Ltd., Shanghai (CN)

(72) Inventors: Ming Wang, Shanghai (CN); Jian-Ping Ying, Shanghai (CN); Jian-Gang Huang, Shanghai (CN); Li-Feng Qiao, Shanghai (CN); Tao Jiang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 449 days.

(21) Appl. No.: 14/689,034

(22) Filed: Apr. 16, 2015

(65) Prior Publication Data
US 2015/0364909 A1 Dec. 17, 2015

(30) Foreign Application Priority Data

Jun. 11, 2014 (CN) .......................... 2014 1 0258321

(51) Int. Cl.
| | |
|---|---|
| *H02H 3/00* | (2006.01) |
| *H02H 3/20* | (2006.01) |
| *G01R 15/14* | (2006.01) |
| *G01R 31/02* | (2006.01) |
| *H02H 7/10* | (2006.01) |

(52) U.S. Cl.
CPC ............. *H02H 3/20* (2013.01); *G01R 15/148* (2013.01); *G01R 31/025* (2013.01); *H02H 7/10* (2013.01)

(58) Field of Classification Search
CPC ....................................................... H02H 3/20
USPC ........................................................ 361/86
See application file for complete search history.

(56) References Cited

U.S. PATENT DOCUMENTS

| | | | |
|---|---|---|---|
| 4,217,621 | A | 8/1980 | Johnson |
| 8,208,276 | B2 | 6/2012 | Sato et al. |
| 2002/0180417 | A1 | 12/2002 | Colby et al. |
| 2014/0132278 | A1 | 5/2014 | Tang et al. |

FOREIGN PATENT DOCUMENTS

| | | |
|---|---|---|
| CN | 101221196 A | 7/2008 |
| CN | 101336378 A | 12/2008 |
| CN | 202309038 U | 7/2012 |
| CN | 202815136 U | 3/2013 |
| CN | 103036415 A | 4/2013 |
| CN | 202888814 U | 4/2013 |
| CN | 103278726 A | 9/2013 |
| CN | 103683202 A | 3/2014 |
| CN | 103701104 A | 4/2014 |

(Continued)

*Primary Examiner* — Stephen W Jackson
(74) *Attorney, Agent, or Firm* — CKC & Partners Co., Ltd.

(57) ABSTRACT

A short-circuit detecting device includes a coil and a processing circuit. The coil is configured to detect a variation of magnetic flux intensity generated by a current variation of a current flowing through a power semiconductor switch and to generate an induced electromotive force based on the variation of magnetic flux intensity. When the current variation rate of said current is greater than a predetermined value, the processing circuit is configured to generate a short-circuit signal based on the induced electromotive force so as to turn off the power semiconductor switch based on the short-circuit signal.

26 Claims, 4 Drawing Sheets

(56) References Cited

FOREIGN PATENT DOCUMENTS

| EP | 1206705 | B1 | 2/2004 |
| EP | 1452877 | A1 | 9/2004 |
| TW | 330319 | | 4/1998 |
| TW | I382189 | B | 1/2013 |

POWER CONVERTER, SHORT-CIRCUIT DETECTING DEVICE THEREOF AND SHORT-CIRCUIT DETECTING METHOD THEREOF

RELATED APPLICATIONS

This application claims priority to China Application Serial Number 201410258321.1 filed on Jun. 11, 2014, which is herein incorporated by reference.

BACKGROUND

Field of Invention

The present invention relates to a detecting device and a detecting method. More particularly, the present invention relates to a power converter, a short-circuit detecting device and a short-circuit detecting method.

Description of Related Art

An insulated gate bipolar transistor (IGBT), one type of fully-controlled power semiconductors, has advantages such as high input impedance, fast switching speed, simple drive circuit, small on-state voltage drop, high voltage-withstanding capability, and high current-withstanding capability, and hence it is widely adopted in the industry.

However, the IGBT has a characteristic of desaturation. Once the IGBT is shorted and enters a linear zone from a saturation zone, its loss will rise greatly and characteristics of the electronic device using the IGBT will be affected significantly.

It can be known from the above that inconvenience and defects still exist in the prior art and need to be improved. To solve the aforementioned problems, people in the related fields have tried very hard to seek for solutions, but adequate solutions have not been found for the long time.

SUMMARY

The purpose of this Summary is to provide brief descriptions of the content of the disclosure so that a reader may have basic understanding of the content of the disclosure. The Summary is not a complete description of the content of the disclosure, and the purpose thereof is not to point out important/key components of the embodiments of the disclosure, or not to define the scope of the disclosure.

An object of the disclosure is to provide a power converter, a short-circuit detecting device thereof, and a short-circuit detecting method thereof for overcoming the problems existing in the prior art.

To achieve the aforementioned object, an aspect of the disclosure is to provide a short-circuit detecting device. The short-circuit detecting device includes a coil and a processing circuit. The coil is configured to detect a variation of magnetic flux intensity generated by a current variation of a current flowing through a power semiconductor switch unit and configured to generate an induced electromotive force based on the variation of magnetic flux intensity. The processing circuit is configured to generate a short-circuit signal based on the induced electromotive force when a current variation rate of the current is greater than a predetermined value, so as to turn off the power semiconductor switch unit based on the short-circuit signal.

To achieve the aforementioned object, another aspect of the disclosure is to provide a power converter. The power converter includes a power semiconductor switch unit and a short-circuit detecting device including a coil. The short-circuit detecting device uses the coil to detect a variation of magnetic flux intensity generated by a current variation of a current flowing through a power semiconductor switch unit. When a current variation rate of the current is greater than a predetermined value, the short-circuit detecting device generates a short-circuit signal based on the variation of magnetic flux intensity. The power converter turns off the power semiconductor switch unit based on the short-circuit signal.

To achieve the aforementioned object, another aspect of the disclosure is to provide a short-circuit detecting method. In the short-circuit detecting method, a variation of magnetic flux intensity generated by a current variation of a current flowing through a power semiconductor switch is detected, and an induced electromotive force is generated based on the variation of magnetic flux intensity; and a short-circuit signal is generated based on the induced electromotive force when a current variation rate of the current is greater than a predetermined value, so as to turn off a power semiconductor switch based on the short-circuit signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

Based on the usual processing, each feature and unit in the figures is not illustrated according to real scales. The way of this illustration is to present specific features and units related to the disclosure. In addition, identical or similar component symbols are referred to similar or the same component/part among different figures.

DETAILED DESCRIPTION

Specific embodiments of the present disclosure are described in detail below in order to make the disclosure more complete and detailed. However, they are not the only form to implement or use the embodiments of the disclosure. The DETAILED DESCRIPTION contains features of many embodiments, steps to construct and operate the embodiments, and the order of the steps. However, other embodiments may be used to achieve such functions and steps.

The terminology used herein has the same meaning with that people skilled in the art can understand unless it is defined additionally in the specification. Furthermore, singular of nouns in the specification may cover plural of the same nouns; and plural of nouns may cover singular of the same nouns when there is no context conflict.

Moreover, "couple" used in the specification means two or more components are physically or electrically connected to the each other directly or indirectly, or it may also mean interactions or interoperations of two or more components.

In order to solve a problem of greatly increased loss caused by a short circuit of a power semiconductor switch, the disclosure provides a short-circuit detecting device. The short-circuit detecting device is capable of detecting a short-circuit status of the power semiconductor switch accurately, then outputting a short-circuit signal to turn off the power semiconductor switch. Therefore, the power semiconductor switch can be prevented from being shorted which causes the greatly increased loss. The short-circuit detecting device will be exemplarily described by figures and embodiments as follows.

Figure 1:
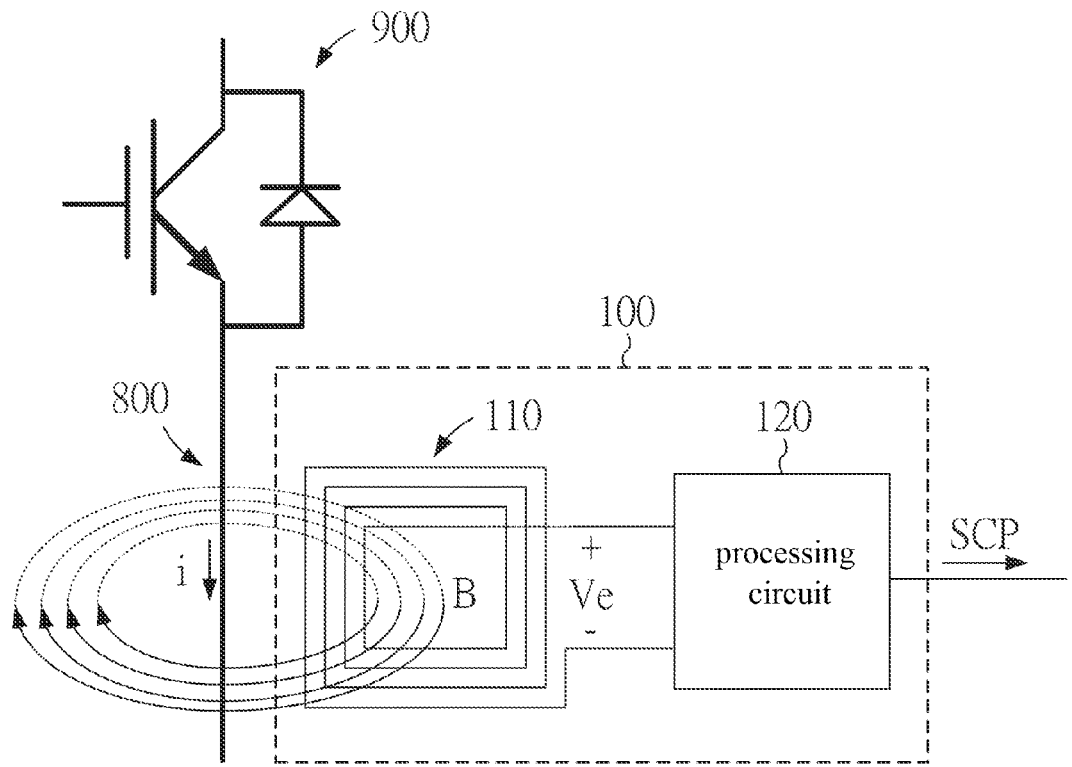
FIG. 1 is a schematic diagram illustrating a power semiconductor switch and its corresponding short-circuit detecting device according to an embodiment of the disclosure.

Refer to FIG. 1, FIG. 1 is a schematic diagram illustrating a power semiconductor switch 900 and its corresponding short-circuit detecting device 100 according to an embodiment of the disclosure. As shown in the figure, a short-circuit detecting device 100 includes a coil 110 and a processing circuit 120. In terms of structure, the coil 110 is electrically coupled to the processing circuit 120. In terms of electrical operations, the coil 110 is configured to detect a variation of magnetic flux intensity B generated by a current variation of a current i flowing through the power semiconductor switch 900, and configured to generate an induced electromotive force Ve based on the variation of magnetic flux intensity. That is, a magnetic flux intensity around the power semiconductor switch 900 is changed by the current variation of a current i flowing through the power semiconductor switch 900, so that a magnetic flux of the coil 100 is changed, and the coil 100 generates an induced electromotive force Ve based on the magnetic flux variation. When the current variation rate of the current i is greater than a predetermined value, the processing circuit 120 generates a short-circuit signal SCP based on the induced electromotive force Ve, so as to turn off the power semiconductor switch 900. However, the short-circuit detecting device 100 in the embodiment of the disclosure is not limited to the structure shown in FIG. 1, which is merely an exemplary implementation of the disclosure. In addition, the predetermined value can be set according to practical requirements.

The difference between the coil 110 and a current transformer (CT) is mainly described herein. The coil 110 is different from the CT and does not contain a core. The coil 110 is directly constructed by the winding of wires, and is used to detect the current variation rate. The output of the coil 110 is a voltage signal. The network impedance connected by the coil 110 is often greater, and the coil 110 is suitable for short protection and can be mounted conveniently. A primary winding and a secondary winding of the CT are wound around a core which has a larger volume and cannot be mounted conveniently. Furthermore, CT uses a transformer theory, in which the current at the primary side is proportional to the current at the secondary side, and the secondary side outputs a current signal connected to a low-impedance network. Besides, an open circuit is not allowed at the secondary side. CT is generally used in current sampling, and may be used for overcurrent protection.

As described above, the short-circuit detecting device 100 provided by the disclosure can use the coil 110 to effectively detect the status of the power semiconductor switch 900. The processing circuit 120 outputs the short-circuit signal SCP based on a short-circuit status of the power semiconductor switch 900, so as to directly or indirectly turn off the power semiconductor switch 900, thereby avoiding the greatly increased loss due to the short circuit of the power semiconductor switch 900 and preventing the characteristics of the electronic device using the power semiconductor switch 900 from being affected. Moreover, the coil 110 in the embodiment of the disclosure can be effectively applied to the detection of the current variation of the power semiconductor switch 900 in the short-circuit status.

In one embodiment, the power semiconductor switch 900 is an insulated gate bipolar transistor (IGBT) or another fully-controlled power semiconductor switch. The short-circuit detecting device 100 can detect the short-circuit status once a short current of the IGBT is rising, without needing to wait until the IGBT enters a desaturation status. Therefore, the detection speed of the short-circuit detecting device 100 is faster. Secondly, the short-circuit detecting device 100 can detect the short-circuit status during the stage at which the short current is rising and then turn off the IGBT, and thus an off current of the IGBT is smaller. Furthermore, the short-circuit detecting device 100 uses the coil 110 to perform detection, in which the area and the turns of the coil 110 can be adjusted based on requirements. Accordingly, the short-circuit detecting device 100 can detect a larger range of current variations, such that the short-circuit detecting device 100 may have broad applications.

Figure 2:
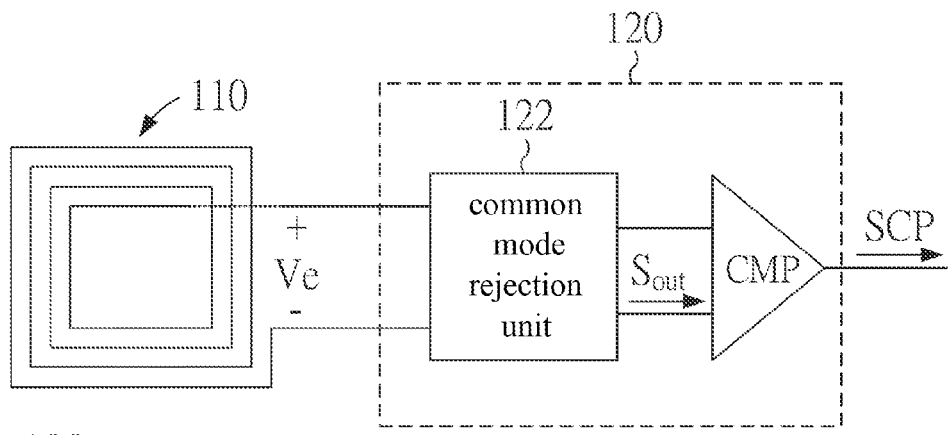
FIG. 2 is a schematic circuit block diagram illustrating the short-circuit detecting device as shown in FIG. 1 according to an embodiment of the disclosure.

FIG. 2 is a schematic circuit block diagram illustrating the short-circuit detecting device 100 as shown in FIG. 1 according to an embodiment of the disclosure. As shown in the figure, the processing circuit 120 includes a common mode rejection unit 122 and a comparing unit CMP. In terms of structure, the common mode rejection unit 122 is coupled between the coil 110 and the comparing unit CMP. In terms of electrical operations, the common mode rejection unit 122 is configured to process the induced electromotive force Ve to generate an output voltage signal $S_{out}$. The comparing unit CMP is configured to generate the short-circuit signal SCP based on the output voltage signal $S_{out}$. However, the short-circuit detecting device 100 in the embodiment of the disclosure is not limited to the structure in FIG. 2, which is merely an exemplary implementation of the disclosure.

Figure 3:
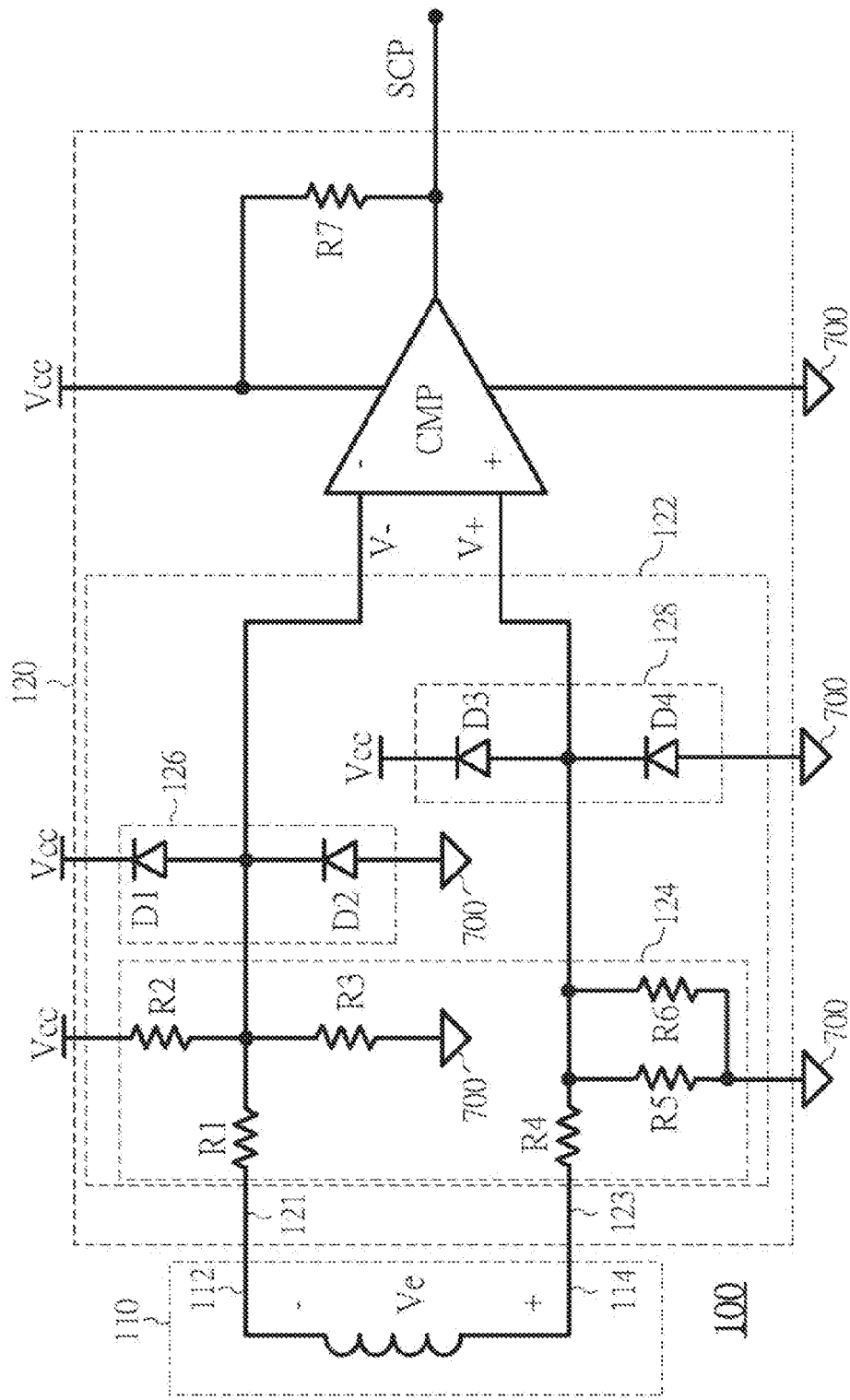
FIG. 3 is a schematic circuit block diagram illustrating the short-circuit detecting device as shown in FIG. 1 according to another embodiment of the disclosure.

FIG. 3 is a schematic circuit block diagram illustrating the short-circuit detecting device 100 as shown in FIG. 1 according to another embodiment of the disclosure. As shown in the figure, the coil 110 includes a first output terminal 112 and a second output terminal 114. In terms of electrical operations, the coil 110 generates the induced electromotive force Ve between the first output terminal 112 and the second output terminal 114 based on the variation of magnetic flux intensity B.

On the other hand, the processing circuit 120 includes the common mode rejection unit 122 and the comparing unit CMP. To be more specific, the common mode rejection unit 122 includes a common mode rejection circuit 124, and the comparing unit CMP includes a non-inverting input and an inverting input. In terms of structure, input terminals 121 and 123 of the common mode rejection circuit 124 are respectively coupled to the first output terminal 112 and the second output terminal 114 of the coil 110. An output terminal of the common mode rejection circuit 124 is coupled to the inverting input and the non-inverting input of the comparing unit CMP. In terms of electrical operations, the common mode rejection circuit 124 is configured to receive and process the induced electromotive force Ve to generate a first output voltage signal and a second output voltage signal. The comparing unit CMP is configured to compare the first output voltage signal with the second output voltage signal to generate the short-circuit signal SCP.

In one embodiment, referring to FIG. 3, the inverting input of the comparing unit CMP is configured to receive the first output voltage signal, and the non-inverting input of the comparing unit CMP is configured to receive the second output voltage signal. Moreover, when the current variation rate of the current is greater than the predetermined value, the second output voltage signal is greater than the first output voltage signal, and the comparing unit CMP generates the short-circuit signal under a condition that the second output voltage signal is greater than the first output voltage signal.

Refer to FIG. 3, in another embodiment, the common mode rejection circuit 124 includes a first resistance R1, a second resistance R2, a third resistance R3, a fourth resistance R4, a fifth resistance R5, and a sixth resistance R6. Moreover, each of the first resistance R1, the second resistance R2, the third resistance R3, the fourth resistance R4, the fifth resistance R5 and the sixth resistance R6 has a first terminal and a second terminal. In terms of structure, the first terminal of the resistance R1 is coupled to the input terminal 121 of the common mode rejection circuit 124. The first terminal of the second resistance R2 is coupled to the second terminal of the first resistance R1. The second terminal of the second resistance R2 is configured to be coupled to a power supply Vcc. The first terminal of the third resistance R3 is configured to be coupled to a ground 700. The second terminal of the third resistance R3 is configured to be coupled to the second terminal of the first resistance R1. The first terminal of the fourth resistance R4 is coupled to the input terminal 123 of the common mode rejection circuit 124. The first terminal of the fifth resistance R5 is coupled to the second terminal of the fourth resistance R4. The second terminal of the fifth resistance R5 is configured to be coupled to the ground 700. The first terminal of the sixth resistance R6 is coupled to the second terminal of the fourth resistance R4 and the first terminal of the fifth resistance R5. The second terminal of the sixth resistance R6 is configured to be coupled to the ground 700. However, the disclosure is limited to the structure shown in FIG. 3, which is merely an exemplary implementation of the disclosure.

Before the electrical operations of the comparing unit CMP are explained, the principle of using the coil 110 in a short-circuit detection is first explained to facilitate the understanding of the operations of the disclosure. Referring to FIG. 1, a busbar 800 is electrically coupled to the power semiconductor switch 900, and the coil 110 of the short-circuit detecting device 100 may be disposed near the busbar 800. Once the power semiconductor switch 900 is shorted, the current i flowing through the busbar 800 will rise rapidly, and the coil 110 is capable of detecting the variation of magnetic flux intensity B generated by the current i. Assuming that dA is a surface element inside the coil 110, and the distance between the surface element and the busbar is r, and then the relationship between the magnetic flux intensity B generated on the surface element and the short current i is as follows:

$$2\pi \cdot r \cdot B / \mu_0 = i \quad \text{(formula 1)}.$$

In addition, the formula of the flux of the coil 110 is as follows:

$$\phi = \int_A N \cdot B \cdot dA = \frac{N \cdot \mu_0 \cdot i}{2\pi} \cdot \int_A \frac{1}{r} \cdot dA. \quad \text{(formula 2)}$$

Assuming that the shape of the coil 110 is known, and the relative relationship between the coil 110 and the busbar 800 is also known, and then $$\int_A \frac{1}{r} \cdot dA$$

will be a constant C. Therefore, the formula of the induced electromotive force at the output terminal of the coil 110 can be written as follows.

$$V_e = \frac{d\phi}{dt} = \frac{N \cdot \mu_0 \cdot C}{2\pi} \cdot \frac{di}{dt}. \quad \text{(formula 3)}$$

Referring to formula 3, if the turns and the area of the coil 110, and the relative location between the coil 110 and the busbar 800 are determined, then the induced electromotive force Ve at the output terminal of the coil 110 will be directly proportional to the short current $$\frac{di}{dt}.$$

With the understanding of the detection principle, referring to FIG. 3, if short current $$\frac{di}{dt}$$

is 0, then the induced electromotive force Ve of the coil 110 will be 0. After the processing of the common mode rejection circuit 124, it will make the second output voltage signal smaller than the first output voltage signal, and the comparing unit CMP will correspondingly output a low level signal. Moreover, if the short current is in the range of $$0 < \frac{di}{dt} < a$$

predetermined threshold, then the second output voltage signal will be still smaller than the first output voltage signal, and the comparing unit CMP will correspondingly output a low level signal. However, it is noted that the voltage difference between the two will be decreased.

Furthermore, if the short current is in the range of $$\frac{di}{dt} >$$

the predetermined threshold, then the second output voltage signal will be greater than the first output voltage signal, and the comparing unit CMP will output a high level signal, that is, the comparing unit CMP will output the short-circuit signal SCP. On the other hand, if the short current is in the range of $$\frac{di}{dt} < 0,$$

then the comparing unit CMP will correspondingly output a low level signal. However, it is noted that the voltage difference between the second output voltage signal and the first output voltage signal will be increased.

In sum, if the short current $$\frac{di}{dt}$$

is greater than the predetermined threshold, then the second output voltage signal will be greater than the first output voltage signal, and meanwhile, the comparing unit CMP will output the short-circuit signal SCP to turn off the power semiconductor switch 900. It needs to be explained herein that the predetermined threshold can be preset according to practical requirements.

Referring to FIG. 3, in one embodiment, the common mode rejection unit 122 further includes a first clamp circuit 126 and a second clamp circuit 128. In terms of structure, the first clamp circuit 126 is coupled to the output terminal of the common mode rejection circuit 124, and the inverting input of the comparing unit CMP. The second clamp circuit 128 is coupled to the output terminal of the common mode rejection circuit 124 and the non-inverting input of the comparing unit CMP. In terms of operations, the first clamp circuit 126 is configured to control the first output voltage signal within a first predetermined range. The second clamp circuit 128 is configured to control the second output voltage signal within a second predetermined range. For example, the first clamp circuit 126 may control the first output voltage signal, such that the first output voltage signal satisfies the following relationship:

$$0 \leq V_- \leq V_{cc} \quad \text{(relationship 1)}$$

In the relationship 1, Vcc is a power supply voltage, and $V_-$ is the first output voltage signal. Therefore, the first clamp circuit 126 can control the first output voltage signal to be smaller than the power supply voltage and greater than zero.

Besides, the second clamp circuit 128 can control the second output voltage signal to satisfy the following relationship:

$$0 \leq V_+ \leq V_{cc} \quad \text{(relationship 2)}$$

In the relationship 2, Vcc is also the power supply voltage, and $V_+$ is the second output voltage signal. Therefore, the second clamp circuit 128 can control the second output voltage signal to be smaller than the power supply voltage and greater than zero.

For example, the first clamp circuit 126 includes a first diode D1 and a second diode D2 in terms of structure. Both of the first diode D1 and the second diode D2 have a first terminal and a second terminal. The first terminal of the first diode D1 is coupled to the inverting input of the comparing unit CMP. The second terminal of the first diode D1 is configured to be coupled to the power supply Vcc. The first terminal of the second diode D2 is configured to the ground 700. The second terminal of the second diode D2 is coupled to the inverting input of the comparing unit CMP.

On the other hand, the second clamp circuit 128 includes a third diode D3 and a fourth diode D4. Each of the third diode D3 and the fourth diode D4 has a first terminal and a second terminal. The first terminal of the third diode D3 is coupled to the non-inverting input of the comparing unit CMP. The second terminal of the third diode D3 is coupled to the power supply Vcc. The first terminal of the fourth diode D4 is configured to be coupled to the ground 700. The second terminal of the fourth diode D4 is coupled to the non-inverting input of the comparing unit CMP. However, the first clamp circuit 126 and the second clamp circuit 128 are not limited to the structure shown in FIG. 3, which is merely an exemplary implementation of the disclosure.

In one embodiment, the short-circuit detecting device 100 in the present embodiment of the disclosure may be applied to a high-voltage high-power field, such as a medium-high voltage converter, a wind power generator, a high-voltage direct current (HVDC) light, etc. Herein, the devices in the aforementioned applications are collectively referred to power converters. As shown in FIG. 1, a power converter (not shown) includes the power semiconductor switch 900 and the short-circuit detecting device 100. Moreover, the short-circuit detecting device 100 includes the coil 110. In terms of electrical operations, the short-circuit detecting device 100 uses the coil 110 to detect the variation of magnetic flux intensity B generated by a current variation of a current flowing through the power semiconductor switch 900, in which the short-circuit detecting device 100 generates the short-circuit signal SCP based on the variation of magnetic flux intensity B. The power converter may turn off the power semiconductor switch 900 based on the short-circuit signal SCP to prevent the power semiconductor switch from being shorted which may cause the greatly increased loss.

Figure 4:
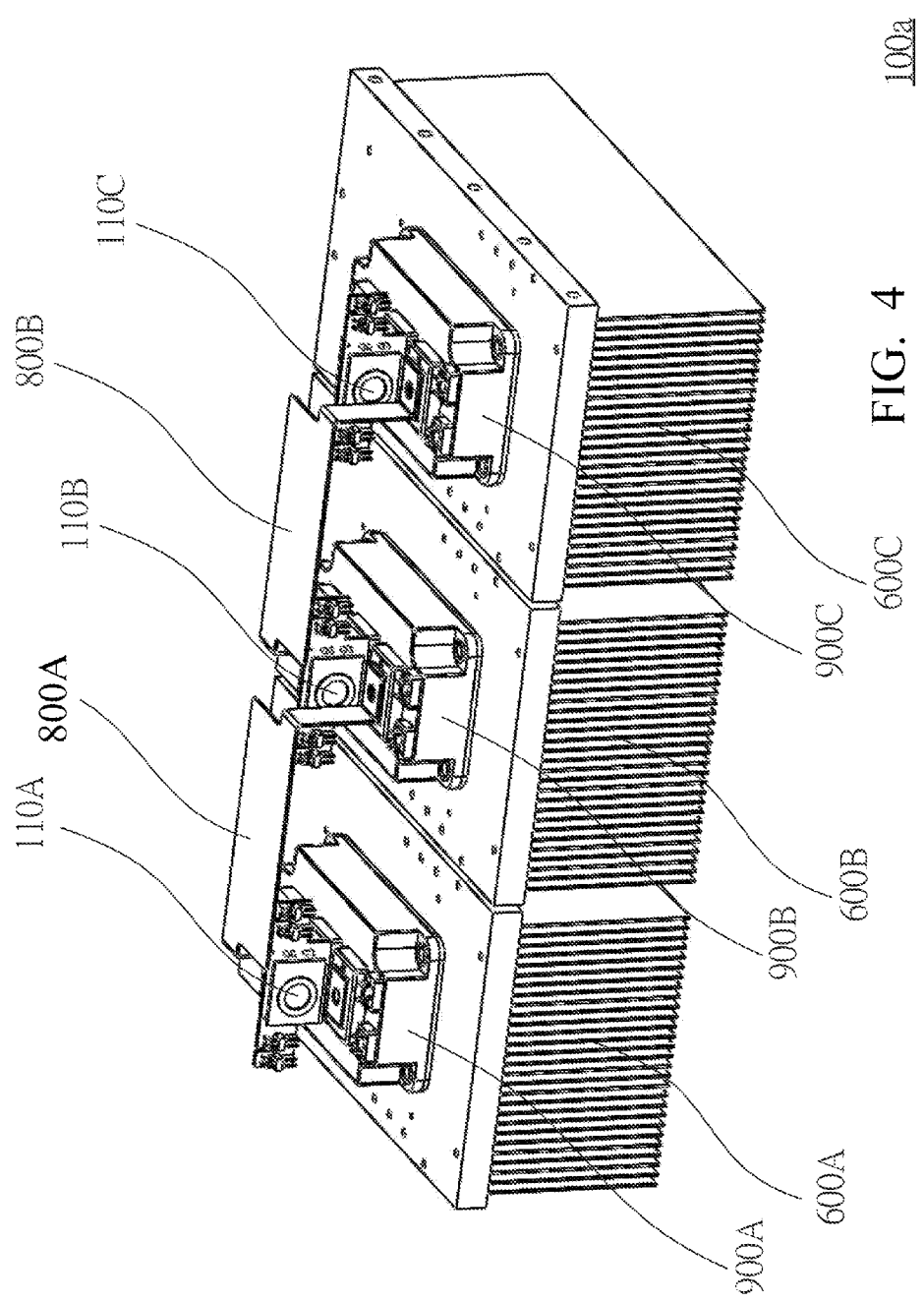
FIG. 4 is a schematic circuit block diagram illustrating the short-circuit detecting device as shown in FIG. 1 according to further another embodiment of the disclosure.

FIG. 4 is a schematic circuit block diagram illustrating the short-circuit detecting device as shown in FIG. 1 according to further another embodiment of the disclosure. As shown in the figure, a short-circuit detecting device 100a includes coils 110A-110C and busbars 800A-800B. And, the short-circuit detecting device 100a can be used to detect power semiconductor switches 900A-900C. In terms of structure, the busbar 800A is coupled to the power semiconductor switch 900A and the power semiconductor switch 900B, such that the power semiconductor switches 900A and 900B are connected in series. Furthermore, the busbar 800B is coupled to the power semiconductor switch 900B and the power semiconductor switch 900C, such that the power semiconductor switch 900B and 900C are connected in series. Besides, the coils 110A-110B are disposed near the busbar 800A, the coils 110B-110C are disposed near the busbar 800B, and the coil 110B is disposed near between the busbar 800A and the busbar 800B. In addition, the components labeled as 600A-600C are heat-sinking elements.

Figure 5:
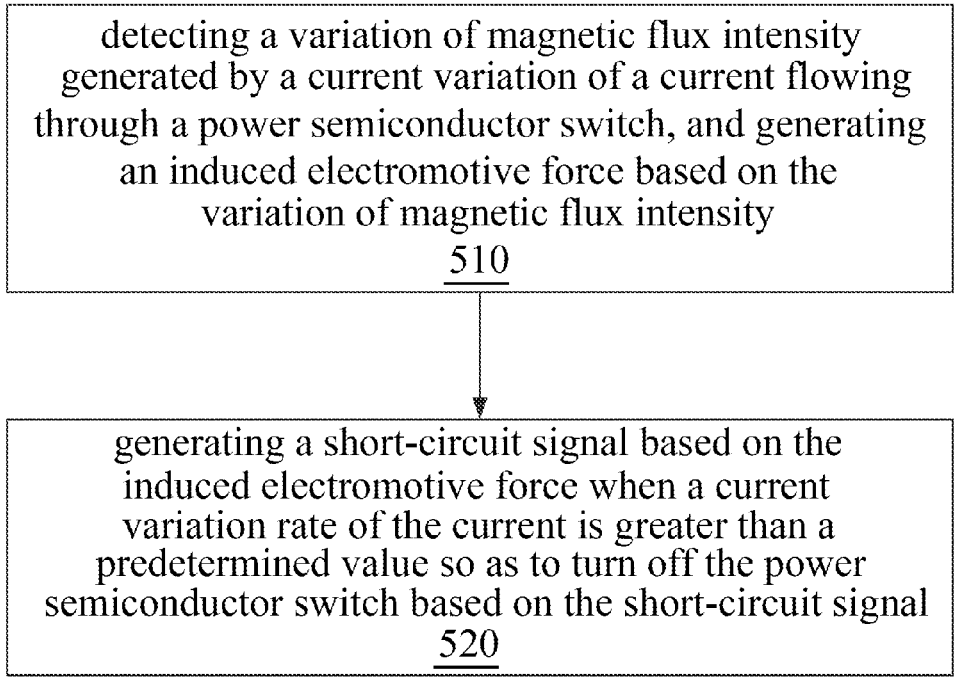
FIG. 5 is a flow chart of a shirt-circuit detecting method according to another embodiment of the disclosure.

FIG. 5 is a flow chart of a shirt-circuit detecting method 500 according to another embodiment of the disclosure. As shown in the figure, the short-circuit method includes:

Step 510: detecting a variation of magnetic flux intensity generated by a current variation of a current flowing through a power semiconductor switch, and generating an induced electromotive force based on the variation of magnetic flux intensity; and Step 520: generating a short-circuit signal based on the induced electromotive force when a current variation rate of the current is greater than a predetermined value, so as to turn off the power semiconductor switch based on the short-circuit signal.

In order to allow the short-circuit detecting method 500 to understood easily, please refer to FIG. 1 and FIG. 5 together. In step 510, a variation of magnetic flux intensity B generated by a current variation of a current flowing through a power semiconductor switch 900 is detected, and an induced electromotive force Ve is generated based on the variation of magnetic flux intensity B by the coil 110. Then, referring to step 520, at step 520 is performed by the processing circuit 120, that is, the processing circuit 120 generates a short-circuit signal SCP based on the induced electromotive force when the current variation rate of the current is greater than a predetermined value, so as to turn off the power semiconductor switch based on the short-circuit signal SCP. However, the steps in the short-circuit method 500 are not limited to being performed by the aforementioned devices, which are just exemplary implementations of the disclosure.

In one embodiment, referring to step 520, the induced electromotive force Ve may also be processed by the common mode rejection unit 122 shown in FIG. 2 to generate the output voltage signal $S_{out}$. Then, the short-circuit signal SCP may also be generated by the comparing unit CMP based on the output voltage signal $S_{out}$.

In another embodiment, referring to FIG. 3 and FIG. 5 together, the step 520 of generating the short-circuit signal based on the induced electromotive force includes: processing the induced electromotive force by the common mode rejection unit 122 to generate a first output voltage signal and a second output voltage signal; and comparing the first output voltage signal and the second output voltage signal by the comparing unit CMP to generate the short-circuit signal SCP. For example, after comparing the first output voltage signal with the second output voltage signal, the comparing unit CMP generates the short-circuit signal SCP under a condition that the second output voltage signal is greater than the first output voltage signal, in which when the current variation rate of the current is greater than a predetermined value, the second output voltage signal is greater than the first output voltage signal. However, the condition of generating the short-circuit signal SCP in the short-circuit detecting method 500 is not limited thereto, and the condition can be set according to practical requirements.

Keep referring to FIG. 3 and FIG. 5, the short-circuit detecting method 500 includes: controlling the first output voltage signal within the first predetermined range, in which this step may be performed by the first clamp circuit 126. In addition, the short-circuit detecting method 500 includes: controlling the second output voltage signal within the second predetermined range, in which this step may be performed by the second clamp circuit 128.

It should be explained that, the steps of the short-circuit detecting method 500 in FIG. 5 are not limited to being performed by the components of the short-circuit detecting device 100. The embodiments above are merely used for describing one of the implementations of the disclosure, and the scope of the short-circuit detecting method 500 in the present embodiment of the disclosure should be defined by the claims.

All of the short-circuit detecting methods 500 described above may be executed by software, hardware and/or firmware. For example, if execution speed and precision are primary considerations, then basically, hardware and/or firmware may be chosen; if design flexibility is the primary consideration, then basically, software may be chosen; alternatively, software, hardware and firmware can be adopted at the same time to operate collaboratively. It should be appreciated that the examples above do not have superior or inferior, and are not used to limit the disclosure. People skilled in the art may design them according to the needs at that time.

Furthermore, people skilled in the art should be able to appreciate that the naming of each step in the short-circuit detecting methods 500 according to its execution function is just to make the technology of the disclosure more easy to understand, but not to limit each step. Integrating the steps into the same step, dividing into several steps, or exchanging one step with another also belongs to the embodiments of the disclosure.

The disclosure contains at least the advantages as follows according to the embodiments of the disclosure described above. A power converter, a short-circuit detecting device thereof and a short-circuit method thereof are provided in the embodiments of the disclosure to detect the status of the power semiconductor switch, and turn off the power semiconductor switch when the power semiconductor switch is in the short-circuit status.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A short-circuit detecting device, comprising:
  a coil configured to detect a variation of magnetic flux intensity generated by a current variation of a current flowing through a power semiconductor switch unit and configured to generate an induced electromotive force based on the variation of magnetic flux intensity, wherein the coil is different from a current transformer, and the current does not flow through the coil; and
  a processing circuit configured to generate a short-circuit signal based on the induced electromotive force when an current variation rate of the current is greater than a predetermined value, so as to turn off the power semiconductor switch unit based on the short-circuit signal.

2. The short-circuit detecting device of claim 1, wherein the processing circuit comprises:
  a common mode rejection unit configured to process the induced electromotive force to generate an output voltage signal; and
  a comparing unit configured to generate the short-circuit signal based on the output voltage signal.

3. The short-circuit detecting device of claim 1, wherein the coil comprises:
  a first output terminal; and
  a second output terminal, wherein the coil generates the induced electromotive force between the first output terminal and the second output terminal based on the variation of magnetic flux intensity;
  wherein the processing circuit comprises:
  a common mode rejection unit configured to receive and process the induced electromotive force to generate a first output voltage signal and a second output voltage signal; and
  a comparing unit configured to compare the first output voltage signal with the second output voltage signal to generate the short-circuit signal.

4. The short-circuit detecting device of claim 3, wherein the comparing unit comprises:

an inverting input configured to receive the first output voltage signal; and a non-inverting input configured to receive the second output voltage signal;

wherein, when the current variation rate of the current is greater than the predetermined value, the second output voltage signal is greater than the first output voltage signal, and the comparing unit generates the short-circuit signal under a condition that the second output voltage signal is greater than the first output voltage signal.

5. The short-circuit detecting device of claim 4, wherein the common mode rejection unit comprises:

a common mode rejection circuit, wherein an input terminal of the common mode rejection circuit is coupled to the first output terminal of the coil and the second output terminal of the coil, and an output terminal of the common mode rejection circuit is coupled to the inverting input of the comparing unit and the non-inverting input of the comparing unit.

6. The short-circuit detecting device of claim 5, wherein the common mode rejection circuit comprises:

a first resistance comprising a first terminal and a second terminal, wherein the first terminal of the first resistance is coupled to the input terminal of the common mode rejection circuit;

a second resistance comprising a first terminal and a second terminal, wherein the first terminal of the second resistance is coupled to the second terminal of the first resistance, and the second terminal of the second resistance is configured to be coupled to a power supply;

a third resistance comprising a first terminal and a second terminal, wherein the first terminal of the third resistance is coupled to a ground, and the second terminal of the third resistance is configured to be coupled to the second terminal of the first resistance;

a fourth resistance comprising a first terminal and a second terminal, wherein the first terminal of the fourth resistance is coupled to the input terminal of the common mode rejection circuit;

a fifth resistance comprising a first terminal and a second terminal, wherein the first terminal of the fifth resistance is coupled to the second terminal of the fourth resistance, and the second terminal of the fifth resistance is configured to be coupled to the ground; and a sixth resistance comprising a first terminal and a second terminal, wherein the first terminal of the sixth resistance is coupled to the second terminal of the fourth resistance and the first terminal of the fifth resistance, and the second terminal of the sixth resistance is configured to be coupled to the ground.

7. The short-circuit detecting device of claim 5, wherein the common mode rejection unit further comprises:

a first clamp circuit coupled to the output terminal of the common mode rejection circuit and the inverting input of the comparing unit, and configured to control the first output voltage signal within a first predetermined range; and a second clamp circuit coupled to the output terminal of the common mode rejection circuit and the non-inverting input of the comparing unit, and configured to control the second output voltage signal within a second predetermined range.

8. The short-circuit detecting device of claim 1, further comprising:

a busbar coupled to the power semiconductor switch unit, wherein the coil is disposed near the busbar.

9. The short-circuit detecting device of claim 1, wherein the power semiconductor switch unit comprises:

a first power semiconductor switch; and a second power semiconductor switch coupled to the first power semiconductor switch.

10. The short-circuit detecting device of claim 9, further comprising:

a first busbar coupled to the first power semiconductor switch; and a second busbar coupled to the second power semiconductor switch;

wherein the coil is disposed near between the first busbar and the second busbar.

11. A power converter, comprising:

a power semiconductor switch unit; and a short-circuit detecting device comprising a coil, wherein the coil is different from a current transformer, the current does not flow through the coil, the short-circuit detecting device uses the coil to detect a variation of magnetic flux intensity generated by a current variation of a current flowing through the power semiconductor switch unit, and when a current variation rate of the current is greater than a predetermined value, the short-circuit detecting device generates a short-circuit signal based on the variation of magnetic flux intensity;

wherein the power converter turns off the power semiconductor switch unit based on the short-circuit signal.

12. The power converter of claim 11, wherein the coil generates an induced electromotive force based on the variation of magnetic flux intensity, and the short-circuit detecting device further comprises:

a processing circuit configured to generate the short-circuit signal based on the induced electromotive force.

13. The power converter of claim 12, wherein the processing circuit comprises:

a common mode rejection unit configured to process the induced electromotive force to generate an output voltage signal; and a comparing unit, configured to generate the short-circuit signal based on the output voltage signal.

14. The power converter of claim 12, wherein the coil comprises:

a first output terminal; and a second output terminal, wherein the coil generates the induced electromotive force between the first output terminal and the second output terminal based on the variation of magnetic flux intensity;

wherein the processing circuit comprises:

a common mode rejection unit configured to receive and process the induced electromotive force to generate a first output voltage signal and a second output voltage signal; and a comparing unit, configured to compare the first output voltage signal with the second output voltage signal to generate the short-circuit signal.

15. The power converter of claim 14, wherein the comparing unit comprises:

an inverting input configured to receive the first output voltage signal; and a non-inverting input configured to receive the second output voltage signal, wherein when the current variation rate of the current is greater than the predetermined value, the second output voltage signal is greater than the first output voltage signal, and the comparing unit generates the short-circuit signal under a condition that the second output voltage signal is greater than the first output voltage signal.

16. The power converter of claim 15, wherein the common mode rejection unit comprises:
a common mode rejection circuit, wherein an input terminal of the common mode rejection circuit is coupled to the first output terminal of the coil and the second output terminal of the coil, and an output terminal of the common mode rejection circuit is coupled to the inverting input of the comparing unit and the non-inverting input of the comparing unit.

17. The power converter of claim 16, wherein the common mode rejection circuit comprises:
a first resistance comprising a first terminal and a second terminal, wherein, the first terminal of the first resistance is coupled to the input terminal of the common mode rejection circuit;
a second resistance comprising a first terminal and a second terminal, wherein the first terminal of the second resistance is coupled to the second terminal of the first resistance, and the second terminal of the second resistance is configured to be coupled to a power supply;
a third resistance comprising a first terminal and a second terminal, wherein the first terminal of the third resistance is configured to be coupled to a ground, and the second terminal of the third resistance is configured to be coupled to the second terminal of the first resistance;
a fourth resistance comprising a first terminal and a second terminal, wherein the first terminal of the fourth resistance is coupled to the input terminal of the common mode rejection circuit;
a fifth resistance comprising a first terminal and a second terminal, wherein the first terminal of the fifth resistance is coupled to the second terminal of the fourth resistance, and the second terminal of the fifth resistance is configured to be coupled to the ground; and
a sixth resistance comprising a first terminal and a second terminal, wherein the first terminal of the sixth resistance is coupled to the second terminal of the fourth resistance and the first terminal of the fifth resistance, and the second terminal of the sixth resistance is configured to be coupled to the ground.

18. The power converter of claim 16, wherein the common mode rejection unit further comprises:
a first clamp circuit coupled to the output terminal of the common mode rejection circuit and the inverting input of the comparing unit, and configured to control the first output voltage signal within a first predetermined range; and
a second clamp circuit coupled to the output terminal of the common mode rejection circuit and the non-inverting input of the comparing unit, and configured to control the second output voltage signal within a second predetermined range.

19. The power converter of claim 18, wherein the first clamp circuit comprises:
a first diode comprising a first terminal and a second terminal, wherein the first terminal of the first diode is coupled to the inverting input of the comparing unit, and the second terminal of the first diode is configured to be coupled to a power supply; and
a second diode comprising a first terminal and a second terminal, wherein the first terminal of the second diode is configured to be coupled to a ground, and the second terminal of the second diode is coupled to the inverting input of the comparing unit.

20. The power converter of claim 18, wherein the second clamp circuit comprises:
a third diode comprising a first terminal and a second terminal, wherein the first terminal of the third diode is coupled to the non-inverting input of the comparing unit, and the second terminal of the third diode is configured to be coupled to a power supply; and
a fourth diode comprising a first terminal and a second terminal, wherein the first terminal of the fourth diode is configured to be coupled to a ground, and the second terminal of the fourth diode is coupled to the non-inverting input of the comparing unit.

21. The power converter of claim 11, further comprising:
a busbar coupled to the power semiconductor switch unit, wherein the coil is disposed near the busbar.

22. The power converter of claim 11, wherein the power semiconductor switch unit comprises:
a first power semiconductor switch; and
a second power semiconductor switch coupled to the first power semiconductor switch.

23. The power converter of claim 22, further comprising:
a first busbar coupled to the first power semiconductor switch; and
a second busbar coupled to the second power semiconductor switch;
wherein the coil is disposed near between the first busbar and the second busbar.

24. A short-circuit detecting method comprising:
detecting, by a core, a variation of magnetic flux intensity generated by a current variation of a current flowing through a power semiconductor switch, and generating an induced electromotive force based on the variation of magnetic flux intensity, wherein the coil is different from a current transformer, the current does not flow through the coil; and
generating a short-circuit signal based on the induced electromotive force when a current variation rate of the current is greater than a predetermined value so as to turn off the power semiconductor switch based on the short-circuit signal.

25. The short-circuit detecting method of claim 24, wherein the step of generating the short-circuit signal based on the induced electromotive force comprises:
processing the induced electromotive force to generate a first output voltage signal and a second output voltage signal; and
comparing the first output voltage signal with the second output voltage signal to generate the short-circuit signal.

26. The short-circuit detecting method of claim 25, wherein the step of comparing the first output voltage signal and the second output voltage signal to generate the short-circuit signal comprises:
generating the short-circuit signal under a condition that the second output voltage signal is greater than the first output voltage signal, wherein when the current variation rate of the current is greater than the predetermined value, the second output voltage signal is greater than the first output voltage signal.

* * * * *